United States Patent
Jin et al.

(10) Patent No.: US 8,368,481 B2
(45) Date of Patent: Feb. 5, 2013

(54) RF SWITCHABLE BALUN

(75) Inventors: Yalin Jin, Austin, TX (US); Vikram Krishnamurthy, Smyrna, GA (US); John Michael Hooper, Smyrna, GA (US)

(73) Assignee: Microsemi Corporation, Alisa Viejo, CA (US)

( * ) Notice: Subject to any disclaimer, the term of this patent is extended or adjusted under 35 U.S.C. 154(b) by 282 days.

(21) Appl. No.: 12/903,387

(22) Filed: Oct. 13, 2010

(65) Prior Publication Data

US 2011/0128088 A1    Jun. 2, 2011

Related U.S. Application Data

(60) Provisional application No. 61/251,586, filed on Oct. 14, 2009.

(51) Int. Cl.
*H03H 7/42* (2006.01)
*H01P 1/10* (2006.01)

(52) U.S. Cl. .......................................... 333/25; 333/101

(58) Field of Classification Search ................ 333/25, 333/26, 238, 101; 455/78
See application file for complete search history.

(56) References Cited

U.S. PATENT DOCUMENTS

| | | | |
|---|---|---|---|
| 7,088,214 B2 * | 8/2006 | Castaneda et al. | 336/200 |
| 7,196,592 B2 | 3/2007 | Shi et al. | |
| 7,209,727 B2 | 4/2007 | Castaneda et al. | |
| 7,538,741 B2 | 5/2009 | Castaneda et al. | |
| 7,796,970 B2 * | 9/2010 | Rofougaran et al. | 455/333 |
| 7,881,677 B2 * | 2/2011 | Marholev et al. | 455/78 |
| 8,068,795 B2 * | 11/2011 | Bavisi et al. | 455/103 |
| 8,076,996 B2 * | 12/2011 | Lee et al. | 333/117 |
| 8,270,926 B2 * | 9/2012 | Roufoogaran et al. | 455/292 |
| 2007/0232241 A1 | 10/2007 | Carley et al. | |
| 2008/0144707 A1 | 6/2008 | Tsfati et al. | |
| 2008/0278258 A1 * | 11/2008 | Liu | 333/25 |

OTHER PUBLICATIONS

International Search Report for PCT/US2010/052436 mailed Dec. 3, 2010—US Patent Office.
Written Opinion of the International Searching Authority for PCT/US2010/052436 mailed Dec. 3, 2010—US Patent Office.
Switchable Balun including parts list—Jul. 2008.
Min and Rebeiz, "5-6 GHz SPDT Switchable Balun Using CMOS Transistors", IEEE Radio Frequency Integrated Circuits Symposium 2008, pp. 321-324, IEEE Piscataway, NJ.

* cited by examiner

*Primary Examiner* — Dean O Takaoka
(74) *Attorney, Agent, or Firm* — Simon Kahn

(57) ABSTRACT

A handheld communication device having an RF front end module has a switchable balun comprising a primary winding having a first two port winding and a second two port winding where a low noise amplifier is operatively coupled to the first and second two port windings and a power amplifier is operatively coupled to the first and second two port windings. A secondary winding is operatively coupled to an antenna, and a transceiver is operatively coupled to the low noise amplifier and the power amplifier. When the switchable balun is in a receive state, the antenna is operatively coupled to the transceiver through the low noise amplifier, and when the switchable balun is in a transmit state, the antenna is operatively coupled to the transceiver through the power amplifier. The ratio of the primary winding to the secondary winding is greater than a one-to-one ratio.

20 Claims, 8 Drawing Sheets

RF SWITCHABLE BALUN

CLAIM OF PRIORITY

This application claims priority to U.S. Provisional Application Ser. No. 61/251,586, filed on Oct. 14, 2009, the entire disclosure of which is incorporated by reference herein.

FIELD OF THE INVENTION

The present invention relates generally to RF switches. More particularly, the present invention relates to a switchable Balun for use in a front end module.

BACKGROUND

Referring to FIG. 1, one of the key elements in an RF/Microwave radio 10 is a T/R (Transmit/Receive) Switch 22. T/R Switch 22 is one component in a Front End Module (FEM) 16. The other components are power amplifiers (PA) 18 and low noise amplifiers (LNA) 20. For time division duplexing (TDD) systems, T/R Switch 22 couples an antenna 24 to PA 18 via an electrical connection 26 during a data/voice transmit mode, and couples antenna 24 to LNA 20 via electrical connection 28 when in data/voice receive mode. T/R Switch 22 provides isolation to the receive section when it is connected to PA 18 during transmit and isolation to the transmit section when it is connected to LNA 20 during receive. T/R Switch 22 is a single-pole double throw (SPDT) type switch that allows connection between antenna 24, PA 18 and LNA 20. A switch connecting multiple PAs and/or multiple LNAs will require a single pole, multi-throw T/R Switch. The T/R Switch IC is typically fabricated in GaAs and is composed of a number of series and shunt FETs (Field Effect Transistors) or HEMTs (High Electron Mobility Transistors).

Referring to FIG. 2, a typical SPdT GaAs RF T/R Switch IC is shown. During transmit mode, the series FETs or HEMT devices on the receive side are off to provide receive isolation and are subject to high voltages when the PA is transmitting at high RF powers (i.e. ~1 Watt) in a 50 Ohm impedance system. The GaAs FET and HEMT devices have a high breakdown voltage and can sustain the large voltage excursions. For typical silicon IC implementations of T/R Switch 22, the FET devices (i.e. typically NMOS) do not have large breakdown voltages and therefore, a T/R Switch implantation in Si CMOS or BiCMOS can usually only handle very limited RF powers.

One approach for resolving this issue is to use SOI (Silicon on Insulator) IC technology. In SOI technology, the NMOS devices have higher breakdown voltages and therefore a RF T/R Switch topology similar to that shown in FIG. 2 may be implemented for high power applications. However, at present time the cost of SOI technology is somewhat prohibitive and integration with other RF components limited. Thus, presently a need exists for a lower cost and higher integration factor for incorporating a high power (~1 Watt) RF T/R Switch in traditional Si CMOS or Si/SiGe BiCMOS technology.

SUMMARY OF THE INVENTION

The present invention recognizes and addresses disadvantages of prior art constructions and methods. Various combinations and sub-combinations of the disclosed elements, as well as methods of utilizing same, which are discussed in detail below, provide other objects, features and aspects of the present invention.

In one embodiment of the present invention, a switchable balun comprising a primary winding operatively coupled to a second port and a third port, wherein the second port is operatively coupled to a low noise amplifier and the third port is operatively coupled to a power amplifier. A secondary winding is operatively coupled to a first port, wherein the first port is operatively coupled to an antenna. A variable capacitor is in parallel with the secondary winding and is configured to transform the impedance seen by the primary winding so that the impedance at the second port and the third port is smaller than the impedance at the first port. When the switchable balun is in a first state, the first port is coupled to the second port, and when the switchable balun is in a second state, the first port is coupled to the third port. The ratio of the primary winding to the secondary winding is at least greater than or equal to a two-to-one ratio.

In some embodiments, the variable capacitor is formed from one or more of MIM capacitors, a voltage controlled varactor and NMOS switches. In these embodiments, a serial-to-parallel bus is operatively coupled to the variable capacitor to digitally control the variable capacitor. In other embodiments, a respective variable capacitor is in parallel with each of the second and third ports.

In other embodiments, the ratio of the primary winding to the secondary winding is at least greater than or equal to a two-to-one ratio. In still other embodiments, the primary winding is formed from a plurality of two port windings.

In another preferred embodiment of the present invention, an RF front end module having a switchable balun comprises a primary winding operatively coupled to a second port and a third port, wherein the second port is operatively coupled to a low noise amplifier and the third port is coupled to a power amplifier. A secondary winding is operatively coupled to a first port, wherein the first port is operatively coupled to an antenna. A variable capacitor is in parallel with the secondary winding. When the switchable balun is in a first state, the first port is operatively coupled to the second port, and when the switchable balun is in a second state, the first port is operatively coupled to the third port. The ratio of the primary winding to the secondary winding is at least greater than or equal to approximately a one and one-half-to-one ratio.

In some embodiments, the switchable balun circuit further comprises a first set of shunt devices in parallel with the second port and a virtual ground and a second set of shunt devices in parallel with the third port and the virtual ground. In these embodiments, the first and the second shunt devices are NMOS shunt devices having respective sources coupled to the virtual ground.

In other embodiments, the power amplifier and the low noise amplifier are operatively coupled to a transceiver. In yet other embodiments, at least one capacitor is in series with the source of the NMOS shunt devices and the virtual ground.

In still other embodiments, the variable capacitor is formed from at least one MIM capacitor, at least one voltage controlled varactor and at least one NMOS switch. In some of these embodiments, a serial-to-parallel bus is operatively coupled to the variable capacitor to digitally control the variable capacitor.

In yet other embodiments, a respective variable capacitor is in parallel with each of the second and third ports.

In still another embodiment in accordance with the present invention, a handheld communication device having an RF front end module comprises a switchable balun comprising a primary winding having a first two port winding and a second two port winding, wherein a low noise amplifier is operatively coupled to the first and the second two port windings and a power amplifier is operatively coupled to the first and the second two port windings. A secondary winding is operatively coupled to an antenna, and a transceiver is operatively coupled to the low noise amplifier and the power amplifier. When the switchable balun is in a receive state, the antenna is operatively coupled to the transceiver through the low noise amplifier, and when the switchable balun is in a transmit state, the antenna is operatively coupled to the transceiver through the power amplifier. The ratio of the primary winding to the secondary winding is greater than a one-to-one ratio.

In some embodiments, the ratio of the primary winding to the secondary winding is at least two-to-one. In other embodiments, the switchable balun further comprises a variable capacitor in parallel with the secondary winding. In still other embodiments, the primary winding further comprises more than two two port windings. In yet other embodiments, the switchable balun further comprising a first capacitor in parallel with the low noise amplifier and a second capacitor in parallel with the power amplifier. In some of these embodiments, the first and the second capacitors are variable shunt capacitors.

Various combinations and sub-combinations of the disclosed elements, as well as methods of utilizing same, which are discussed in detail below, provide other objects, features and aspects of the present invention.

The accompanying drawings, which are incorporated in and constitute a part of this specification, illustrate one or more embodiments of stacked displays of the present invention.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
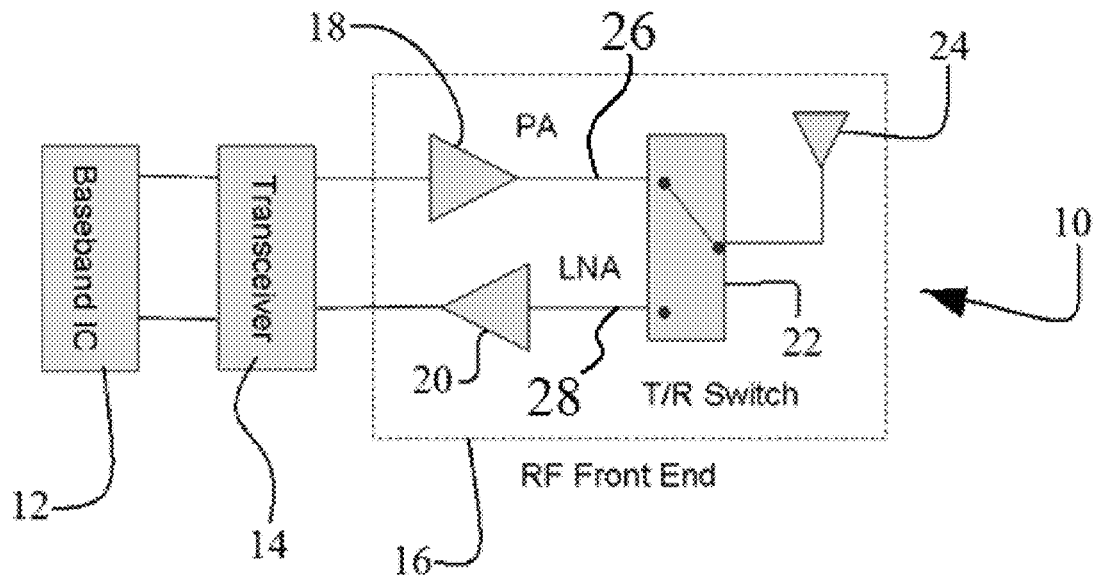
FIG. 1 is a schematic layout of a prior art RF front end module.
Figure 2:
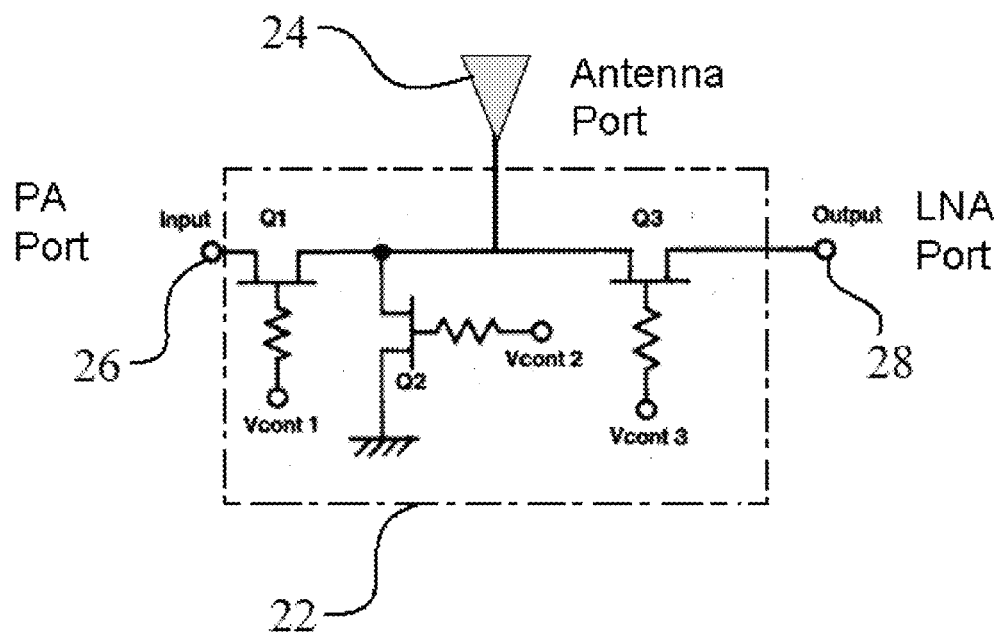
FIG. 2 is a schematic view of a prior art RF switch for use in the prior art RF front end module of FIG. 1.

Repeat use of reference characters in the present specification and drawings is intended to represent same or analogous features or elements of the invention according to the disclosure.

DETAILED DESCRIPTION OF THE PREFERRED EMBODIMENT

Reference will now be made in detail to presently preferred embodiments of the invention, one or more examples of which are illustrated in the accompanying drawings. Each example is provided by way of explanation, not limitation, of the invention. It is to be understood by one of ordinary skill in the art that the present discussion is a description of exemplary embodiments only, and is not intended as limiting the broader aspects of the present invention, which broader aspects are embodied in the exemplary constructions. In fact, it will be apparent to those skilled in the art that modifications and variations can be made in the present invention without departing from the scope and spirit thereof. For instance, features illustrated or described as part of one embodiment may be used on another embodiment to yield a still further embodiment. Thus, it is intended that the present invention covers such modifications and variations as come within the scope of the appended claims and their equivalents.

Figure 3:
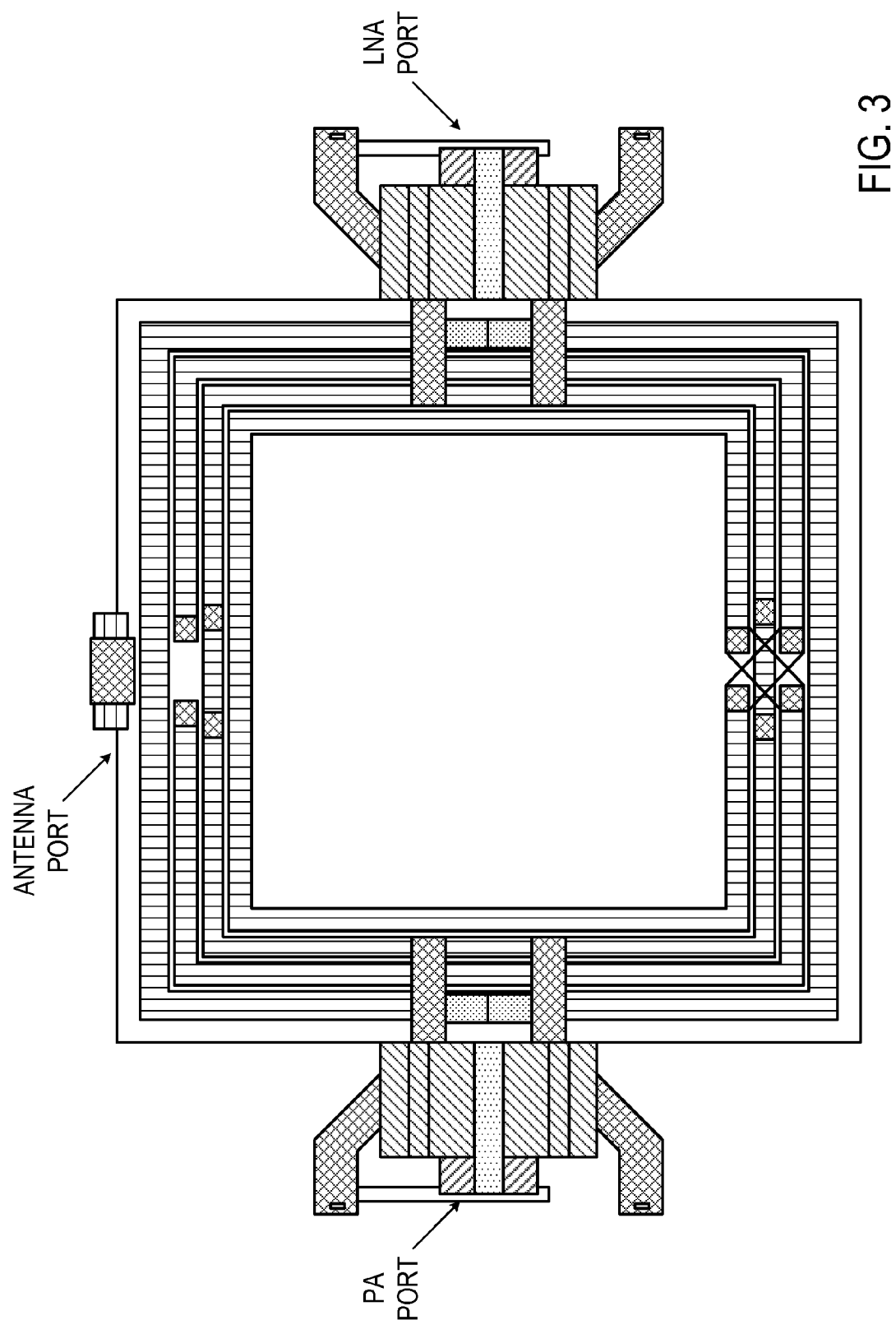
FIG. 3 is a simulated switchable balun circuit layout in accordance with one embodiment of the present invention.
Figure 4:
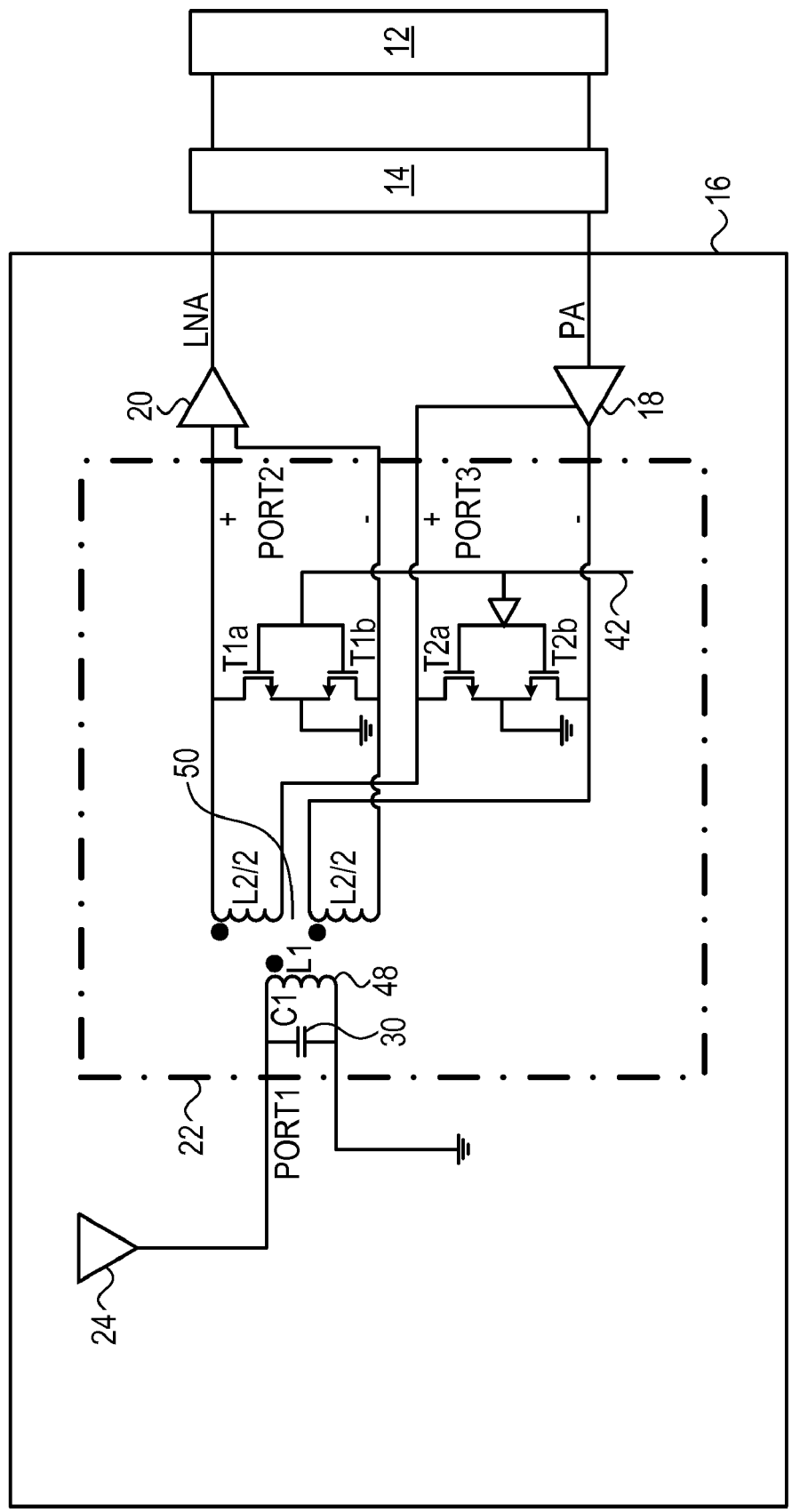
FIG. 4 is a schematic view of the switchable balun circuit shown in a RF front end module in accordance with one embodiment of the present invention.

Referring to FIGS. 3 and 4, a switchable balun circuit 22 is shown in an RF front end 16. Switchable balun circuit 22 has a first port coupled to antenna 24, a second port 2 coupled to LNA 20 and a third port 3 coupled to PA 18. Ports 2 and 3 are coupled to port 1 via a switchable balun circuit with a primary winding 50 and a secondary winding 48. First and second NMOS shunt devices $T_{1a}$ and $T_{1b}$ are coupled across an output of primary winding 50. Third and fourth NMOS shunt devices $T_{2a}$ and $T_{2b}$ are also coupled across the output of primary winding 50. Thus, during transmit mode, NMOS shunt devices $T_{1a}$ and $T_{1b}$ are shorted to a virtual ground allowing a signal to pass from transceiver 14 across primary and secondary windings 50 and 48 to antenna 24, while NMOS shunt devices $T_{2a}$ and $T_{2b}$ are off and open. In the receive mode, switches $T_{2a}$ and $T_{2b}$ are on and shorted, while $T_{1a}$ and $T_{1b}$ are off and open allowing transmission from antenna 24 through LNA 20 to transceiver 14.

It should be understood that the turns ratio may be less than 2:1 depending on the application of the balun circuit. In the configuration shown in FIG. 4, the turns ratio of $L_2$ to $L_1$ is a ratio of 2:1 or greater so that an impedance transformation occurs at LNA port 2 and PA port 3. A turns-ratio of $\geq 2:1$ provides for lower voltage swings across port 3 resulting in high power transmission at the PA without causing breakdown of NMOS shunt device $T_{2a}$ and $T_{2b}$, which are open during transmit mode. That is, during transmit mode, NMOS $T_{1a}$ and $T_{1b}$ are shorted, and $T_{2a}$ and $T_{2b}$ are open and are subjected to high voltages when the PA is transmitting and switchable balun 22 is transforming a 50 Ohm single ended impedance at antenna 24 to a (50 Ohm/(turns ration)$^2$)=12.5 Ohm differential impedance at PA 18 and LNA 20.

In one preferred embodiment, LNA port 2 and PA port 3 can be designed to have low impedance such as about 15 ohms differential, and antenna port 1 can be designed to be at 50 Ohms. The lower impedance limits voltage swings on NMOS devices $T_{2a}$ and $T_{2b}$ while in the transmit mode. For example, a 1 W output from differential PA 18 results in a voltage swing across NMOS switch devices $T_{2a}$ and $T_{2b}$ of approximately 2.7V. Impedance transformation may be achieved by having a turns ratio between primary and secondary windings 50 and 48 of much greater than 1.0:1.0. In one embodiment the turns ratio is 1.5:1.0.

For example, a typical turns-ratio of 2:1 will provide a four-to-one (Input Ohms/(turns-ratio)$^2$) impedance transformation. Switchable balun 22 shown in FIG. 4 includes a layout of a switchable balun with an impedance transformation from 15 Ohms/−5 pF differential at the PA port 3 and LNA port 2 to 50 Ohms single ended at the antenna port 1. The impedance at PA port 3 is chosen to match the optimal PA output impedance for maximum linear output power. To effect the impedance at output ports 2 and 3, a variable shunt capacitor 30 is placed in parallel at antenna port 1 to change the impedance when looking into port 1 from secondary coil 48.

Figure 5:
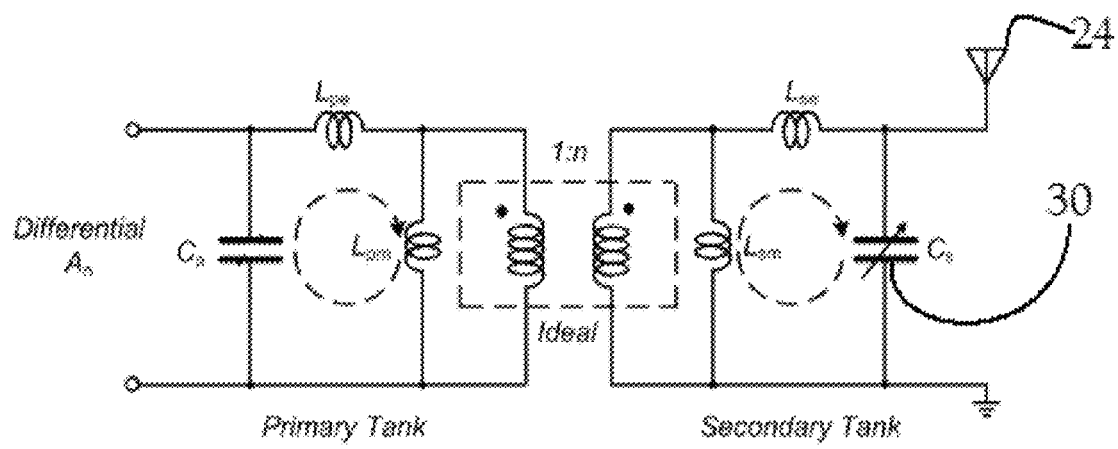
FIG. 5 is an electrical representation of the switchable balun circuit of FIG. 4.

To understand this behavior and referring to FIG. 5, one can view switchable balun circuit 22 "electrically" as composed of an ideal transformer with a shunt coupling inductance $L_{sm}$ and a series leakage inductance $L_{se}$ on both sides of the ideal transformer. By adding a tunable capacitor 30 in parallel at the antenna port, the impedance looking into the electrical network, consisting of the series leakage inductance $L_{se}$, the shunt coupling inductance $L_{sm}$, shunt tuning capacitor 30, and a 50 ohm antenna port can be lowered. As a result, the modified impedance looking into the antenna port will be translated through the "impedance transformation" to result in a new impedance for the PA and LNA ports. It should be understood that a parasitic switch capacitance, when NMOS devices are in the off mode, will also contribute to the total shunt capacitance and must be taken into account in the electrical analysis.

Figure 6:
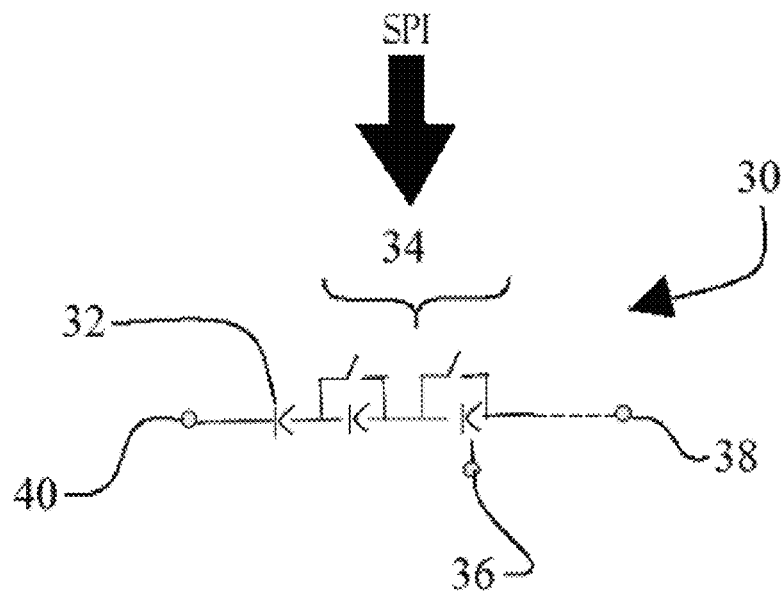
FIG. 6 is a schematic view of a variable capacitor for use in the switchable balun circuit of FIG. 4.

Referring to FIG. 6, one preferred embodiment of tunable capacitor 30 is shown having a serial and/or parallel combination of MIM capacitor 32, a voltage controlled varactor 36, and NMOS switches 34, or any combination of the above mentioned devices. A SPI (serial to parallel) bus connected to switches 34 allows digital tuning of the capacitance value by digitally switching the switches on and off. The digital capacitance tuning can be coordinated with the PA output power to optimize impedance at PA port 3 at different PA output powers to optimize the PA efficiency at each power level.

Another application of the digital capacitance tuning is to adjust the impedances at the PA and LNA ports depending on whether the RF radio is in transmit or receive mode. For example, in the receive mode digital tuning can optimize the PA and LNA port impedances for the LNA to achieve key figures of merit such as a low noise and high input third order intercept point (IIP3). In the transmit mode, the PA and LNA port impedance can be optimized for maximum PA efficiency, PA power, and/or PA linearity. In short, a variable shunt capacitor allows for optimization of transmit and receive port impedance depending on the operation of switchable balun 22.

Figure 7:
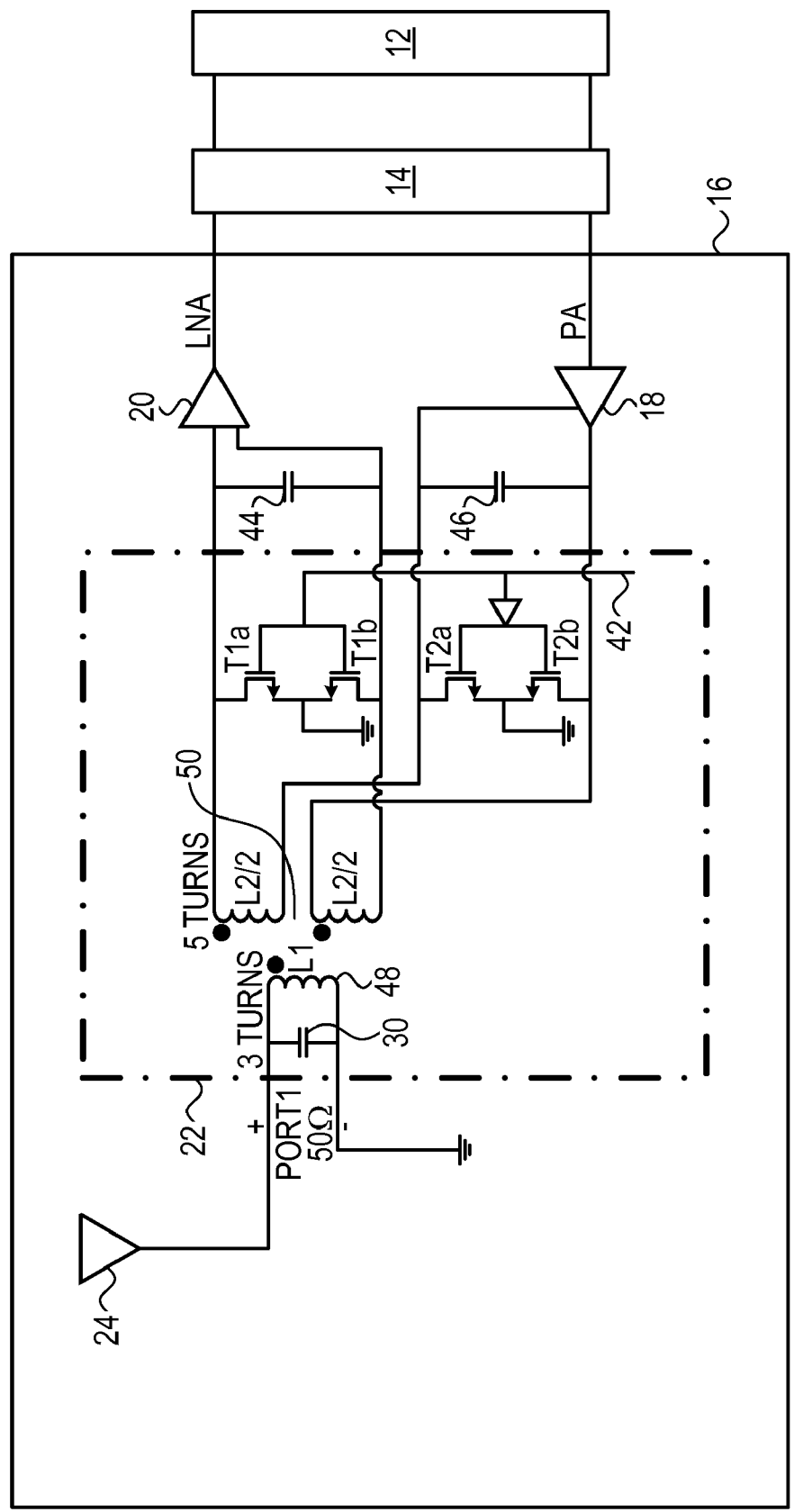
FIG. 7 is a schematic view of a switchable balun circuit in accordance with one embodiment of the present invention having variable capacitors at the various ports.
Figure 8:
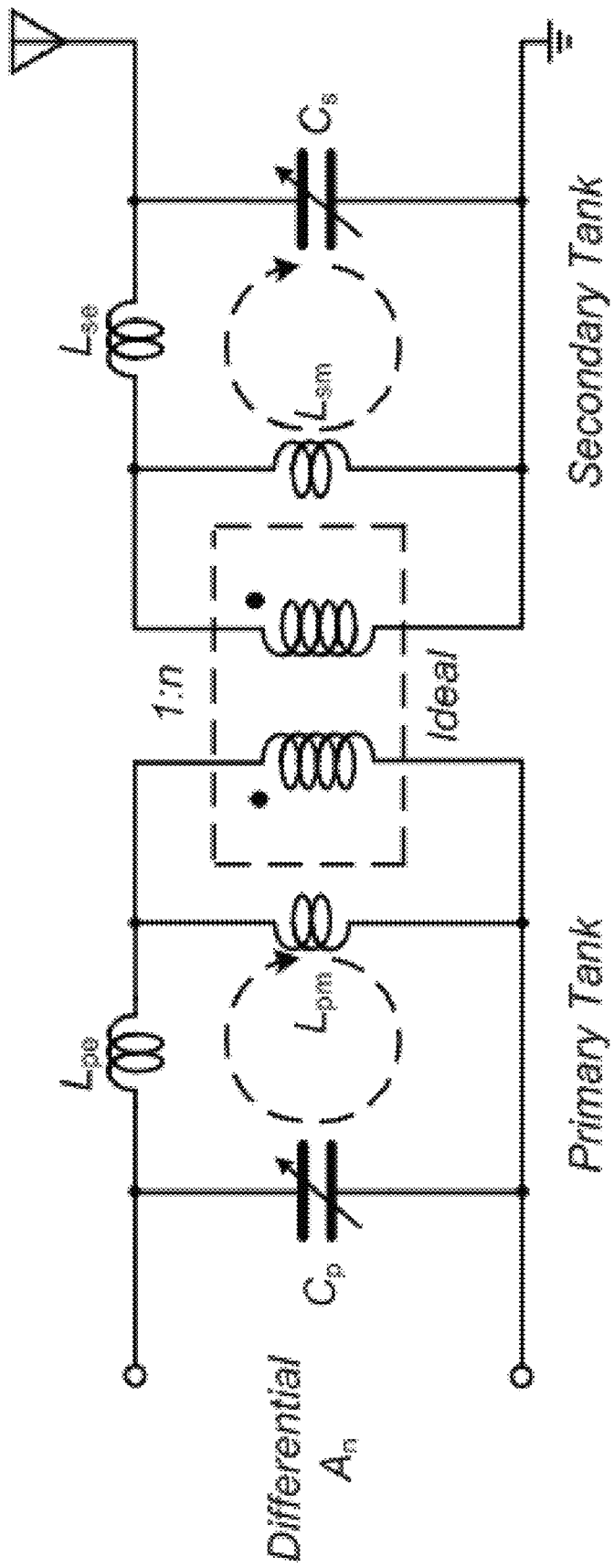
FIG. 8 is an electrical representation of the switchable balun circuit of FIG. 7.

Referring to FIGS. 7 and 8, to tune the center frequency of switchable balun 22, variable shunt capacitors 44 and 46 can be placed parallel to respective ports 2 and 3. By tuning shunt capacitors 44 and 46 and variable shunt capacitor 30 at the antenna port, the center frequency may be adjusted by altering the L-C characteristics at each port. It should be noted that the center frequency tuning can be varied in time using a broad band PA and LNA to transmit or receive in one particular sub-band at any particular time.

Referring specifically to FIG. 8, an electrical diagram of switchable balun 22 of FIG. 7 illustrates how the center frequency can be tuned. The series leakage inductance $L_{se}$, the shunt coupling inductance $L_{sm}$ and shunt tuning capacitor $C_s$ (including the switch capacitance) on both sides act as a tank circuit with a resonant frequency. Tuning shunt capacitors $C_p$ and $C_s$ allows the resonant frequency at both ports to be adjusted to a desired value and hence result in a frequency agile switchable balun circuit.

Figure 9:
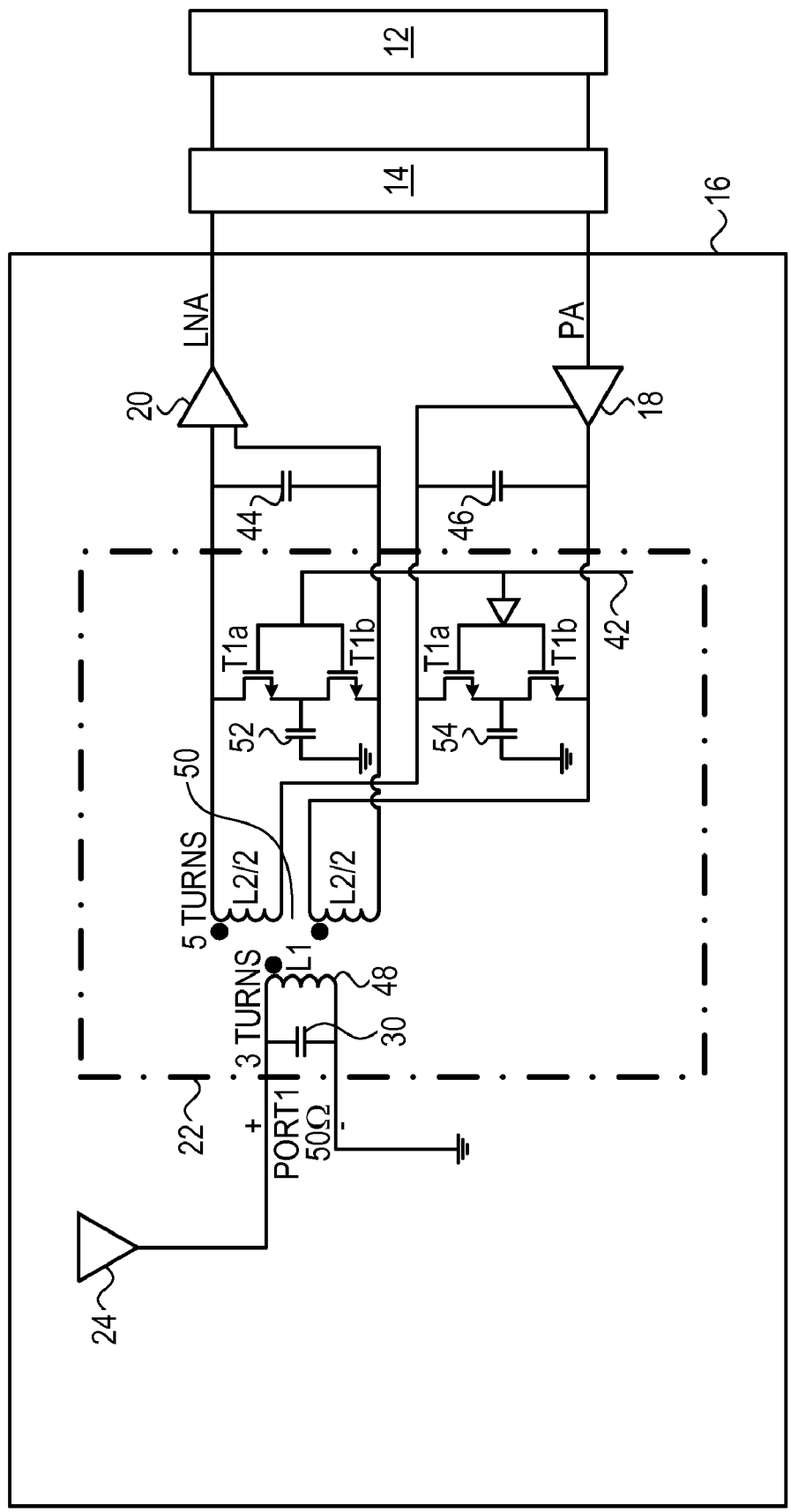
FIG. 9 is schematic view of a switchable balun circuit in accordance with one embodiment of the present invention having a harmonic trap.

Referring to FIG. 9, another embodiment of a switchable balun 22 is shown having a similar circuit design to that shown in FIG. 7. One key difference of the embodiment shown in FIG. 9 is that series capacitors 52 and 54 are coupled between respective sources of NMOS switch devices $T_{1a}/T_{1b}$ and $T_{2a}/T_{2b}$ and a virtual ground of differential switch 22. This configuration allows the switchable balun to "trap" or suppress harmonics ($2^{nd}$ order harmonics in particular) generated by PA 18 since most communication systems have a limit on the second harmonics that may be transmitted.

It should be noted that the "virtual" ground is established in all differential topologies and does not necessarily have to be connected directly to a "hard" ground. The value of the series capacitor can be tuned to provide a low impedance short for the second harmonic. An added benefit is that the second harmonic trap will enhance the efficiency of the power amplifier by reducing the "peaking" behavior of the voltage waveform which causes more overlap with the current waveform and hence more V*I losses. With regard to the third harmonic, a "trap" consisting of a parallel L-C tank between PA 18 and switchable balun 22 can be used to suppress the third harmonic levels reaching the antenna. In addition, switchable balun 22 provides some attenuation of the third harmonic since it will not typically have the bandwidth to cover low insertion loss performance from the center frequency to the third harmonic.

Figure 10:
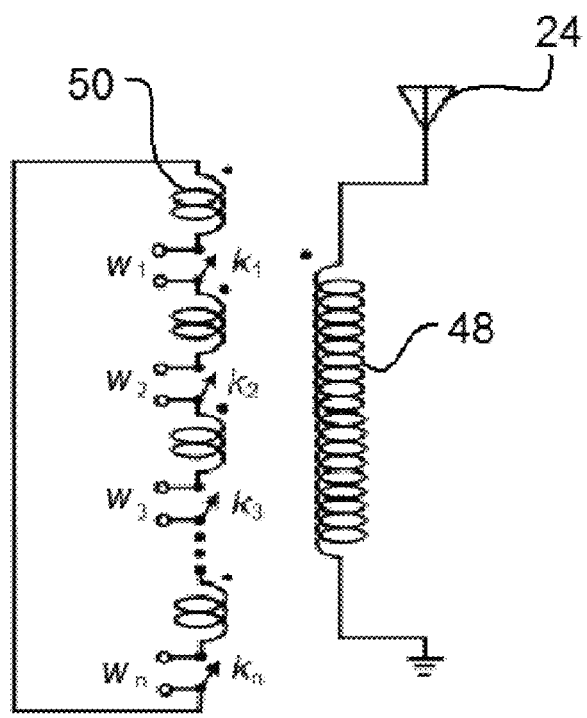
FIG. 10 is a schematic view of a portion of a switchable balun circuit providing multiple output ports in accordance with one embodiment of the present invention.
Figure 11:
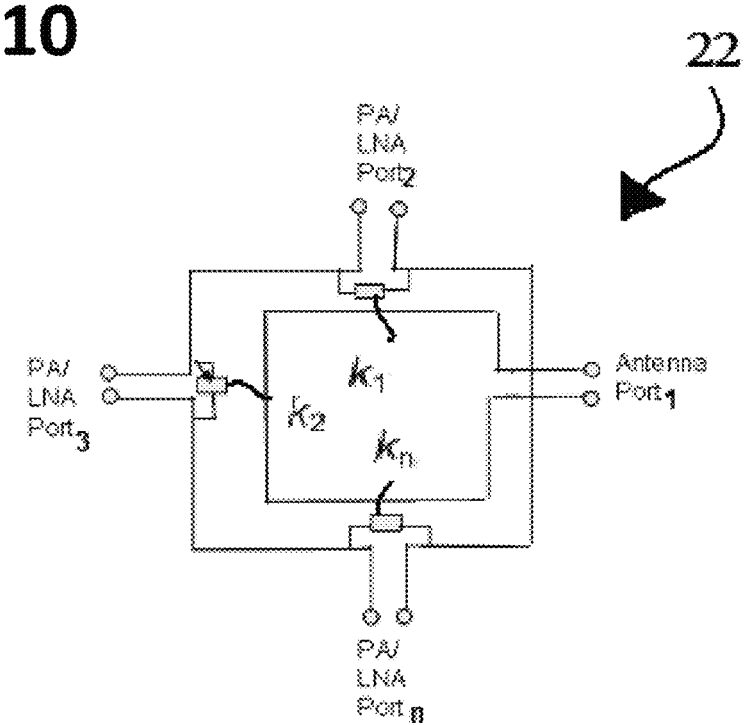
FIG. 11 is a schematic view of the multi-port switchable balun circuit of FIG. 10.

Referring to FIGS. 10 and 11, switchable balun 22 may also be configured to accommodate more than one PA and/or LNA. In particular and referring to FIG. 10, multiple two port windings $w_1$-$w_n$ may form primary winding 50. Each two port winding enables any combination of multiple PAs and LNAs to be coupled to an antenna 24 through secondary winding 48. A plurality of switches $k_1$-$k_n$ allows the various PAs and LNAs to be switched in and out of the circuit to accommodate for multiple frequency bands as well as multiple modes such as CDMA, 3G, and 4G. FIG. 11 illustrates a switchable balun 22 having a single antenna port 1 and multiple LNA/PA port 2-port n with differential switches $k_1$-$k_n$.

It should be understood that this topology can be extended to a large number of ports, and theoretically unlimited number of ports for the switchable balun. For example, the primary and secondary windings can be shaped as an octagon and a total of eight ports can be realized. A wide variety of geometries can be realized in a number of IC processes.

While one or more preferred embodiments of the invention are described above, it should be appreciated by those skilled in the art that various modifications and variations can be made in the present invention without departing from the scope and spirit thereof. For example, the fluid heater described herein may be used in various applications such as a fluid heater for carpet cleaning, a water heater for a residential house, a water heater for an apartment building or as a water heater or even a large-scale boiler system in a commercial setting. It is intended that the present invention cover such modifications and variations as come within the scope and spirit of the appended claims and their equivalents.

What is claimed is:

1. A switchable balun comprising:
    a. a primary winding operatively coupled to a second port and a third port, wherein
        i. said second port is operatively coupled to a low noise amplifier; and
        ii. said third port is operatively coupled to a power amplifier,
    b. a secondary winding operatively coupled to a first port, wherein said first port is operatively coupled to an antenna; and
    c. a first variable capacitor in parallel with said secondary winding, said first variable capacitor configured to transform the impedance seen by said primary winding so that the impedance at said second port and said third port is smaller than the impedance at said first port,
wherein
when said switchable balun is in a first state, said first port is coupled to said second port,
when said switchable balun is in a second state, said first port is coupled to said third port, and
wherein the ratio of said primary winding to said secondary winding is at least greater than or equal to a one-to-one ratio.

2. The switchable balun circuit of claim 1, wherein said first variable capacitor is formed from one or more of metal-insulator-metal (MIM) capacitors, a voltage controlled varactor and NMOS switches.

3. The switchable balun circuit of claim 2, further comprising a serial-to-parallel bus operatively coupled to said first variable capacitor, said first variable capacitor responsive to digital signals received from said serial-to-parallel bus to tune the capacitance value of said first variable capacitor.

4. The switchable balun circuit of claim 1, further comprising respective second and third variable capacitors in parallel with each of said second and third ports.

5. The switchable balun circuit of claim 1, wherein said ratio of said primary winding to said secondary winding is at least greater than or equal to a two-to-one ratio.

6. The switchable balun circuit of claim 1, wherein said primary winding is formed from a plurality of two port windings.

7. A radio frequency (RF) front end module having a switchable balun comprising:
a. a primary winding operatively coupled to a second port and a third port, wherein
 i. said second port is operatively coupled to a low noise amplifier; and
 ii. said third port is coupled to a power amplifier,
b. a secondary winding is operatively coupled to a first port, wherein said first port is operatively coupled to an antenna;
c. a variable capacitor in parallel with said secondary winding, said variable capacitor configured to transform the impedance seen by said primary winding so that the impedance at said second port and said third port is smaller than the impedance at said first port,
wherein
when said switchable balun is in a first state, said first port is operatively coupled to said second port,
when said switchable balun is in a second state, said first port is operatively coupled to said third port, and
the ratio of said primary winding to said secondary winding is at least greater than or equal to a one and one-half-to-one ratio.

8. The RF front end module of claim 7, said switchable balun circuit further comprising:
a. a first set of shunt devices connected between said second port and a virtual ground; and
b. a second set of shunt devices connected between said third port and said virtual ground.

9. The RF front end module of claim 8, wherein said first and said second shunt devices are NMOS shunt devices having respective sources coupled to said virtual ground.

10. The RF front end module of claim 7, wherein said power amplifier and said low noise amplifier are operatively coupled to a transceiver.

11. The RF front end module of claim 9, further comprising at least one capacitor in series with said source of said NMOS shunt devices and said virtual ground.

12. The RF front end module of claim 7, wherein said variable capacitor is formed from at least one metal-insulator-metal (MIM) capacitor, at least one voltage controlled varactor and at least one NMOS switch.

13. The RF front end module of claim 12, further comprising a serial-to-parallel bus operatively coupled to said variable capacitor, said variable capacitor responsive to digital signals received from said serial-to-parallel bus to tune the capacitance value of said variable capacitor.

14. The RF front end module of claim 7, further comprising a respective additional variable capacitor in parallel with each of said second and third ports.

15. An handheld communication device having an RF front end module comprising
a. a switchable balun comprising:
 i. a primary winding having a first two port winding and a second two port winding, wherein
  a. an input of a low noise amplifier is operatively coupled to said first and said second two port windings; and
  b. an output of a power amplifier is operatively coupled to said first and said second two port windings,
 ii. a secondary winding operatively coupled to an antenna; and
 iii. a first variable capacitor in parallel with said secondary winding, said first variable capacitor configured to transform the impedance seen by said primary winding so that the impedance at the output of said power amplifier and the input of said low noise amplifier are each smaller than the impedance at said antenna,
b. a transceiver operatively coupled to said low noise amplifier and said power amplifier,
wherein
when said switchable balun is in a receive state, said antenna is operatively coupled to said transceiver through said low noise amplifier,
when said switchable balun is in a transmit state, said antenna is operatively coupled to said transceiver through said power amplifier, and
the ratio of said primary winding to said secondary winding is greater than a one-to-one ratio.

16. The handheld communication device of claim 15, wherein said ratio of said primary winding to said secondary winding is at least two-to-one.

17. The handheld communication device of claim 15, said switchable balun further comprising an additional variable capacitor in parallel with said primary winding.

18. The handheld communication device of claim 15, wherein said primary winding further comprise at least one additional two port winding.

19. The handheld communication device of claim 15, said switchable balun further comprising a first capacitor in parallel with said low noise amplifier and a second capacitor in parallel with said power amplifier.

20. The handheld communication device of claim 19, wherein said first and said second capacitors are variable shunt capacitors.

* * * * *